US010101607B2

(12) United States Patent
Lee et al.

(10) Patent No.: US 10,101,607 B2
(45) Date of Patent: Oct. 16, 2018

(54) DISPLAY DEVICE

(71) Applicant: SAMSUNG DISPLAY CO., LTD., Yongin-si, Gyeonggi-do (KR)

(72) Inventors: Kye Uk Lee, Hwaseong-si (KR); Dong Hyun Yoo, Hwaseong-si (KR); Seong Young Lee, Hwaseong-si (KR); Kyung Hoe Lee, Seoul (KR)

(73) Assignee: Samsung Display Co., Ltd. (KR)

( * ) Notice: Subject to any disclaimer, the term of this patent is extended or adjusted under 35 U.S.C. 154(b) by 85 days.

(21) Appl. No.: 14/581,758

(22) Filed: Dec. 23, 2014

(65) Prior Publication Data

US 2016/0033815 A1 Feb. 4, 2016

(30) Foreign Application Priority Data

Aug. 1, 2014 (KR) .................. 10-2014-0099167

(51) Int. Cl.
*G02F 1/1335* (2006.01)
*H01L 27/32* (2006.01)
*H01L 51/52* (2006.01)
*G02F 1/1333* (2006.01)

(52) U.S. Cl.
CPC .. *G02F 1/133514* (2013.01); *G02F 1/133305* (2013.01); *H01L 27/322* (2013.01); *H01L 51/5284* (2013.01)

(58) Field of Classification Search
CPC ......... G02F 1/133514; G02F 1/133305; H01L 27/322; H01L 51/5284
USPC .................................................. 349/106–109
See application file for complete search history.

(56) References Cited

U.S. PATENT DOCUMENTS

| 8,269,925 | B2* | 9/2012 | Ochiai | G02F 1/133512 |
| | | | | 349/106 |
| 8,749,737 | B2* | 6/2014 | Chen | H01L 27/322 |
| | | | | 349/106 |
| 2007/0085862 | A1* | 4/2007 | Moriya | G09G 3/2003 |
| | | | | 345/694 |
| 2008/0143936 | A1* | 6/2008 | Wang | G02F 1/133514 |
| | | | | 349/109 |
| 2009/0141221 | A1* | 6/2009 | Taguchi | G02F 1/133512 |
| | | | | 349/109 |
| 2009/0189128 | A1* | 7/2009 | Takiguchi | C09D 11/101 |
| | | | | 252/586 |

(Continued)

FOREIGN PATENT DOCUMENTS

| KR | 10-2008-0057379 | 6/2008 |
| KR | 10-2008-0062595 | 7/2008 |

(Continued)

*Primary Examiner* — Charles Chang
(74) *Attorney, Agent, or Firm* — Innovation Counsel LLP

(57) ABSTRACT

A display device may include a first substrate having a predetermined radius of curvature, a second substrate facing the first substrate, a plurality of gate line and a plurality of data lines intersecting each other on the first substrate, a black matrix disposed on the second substrate and at least part of the black matrix overlapping the plurality of gate lines and the plurality of data lines so as to define a plurality of pixel areas, a plurality of pixel electrode in the plurality of pixel areas on the first substrate, and a plurality of color filters in the plurality of pixel areas on the second substrate. A distance between adjacent color filters is different depending on where the pixel areas are located.

11 Claims, 8 Drawing Sheets

(56) References Cited

U.S. PATENT DOCUMENTS

| | | | |
|---|---|---|---|
| 2011/0255039 A1* | 10/2011 | Enomoto | G02F 1/133305 349/113 |
| 2013/0321499 A1 | 12/2013 | Park et al. | |
| 2014/0049740 A1* | 2/2014 | Xu | G02F 1/134363 349/141 |
| 2014/0065430 A1* | 3/2014 | Yamazaki | H01L 27/1214 428/426 |
| 2015/0370121 A1* | 12/2015 | Wu | G02F 1/133514 349/106 |
| 2015/0378070 A1* | 12/2015 | Wu | G02B 5/201 359/885 |

FOREIGN PATENT DOCUMENTS

| | | |
|---|---|---|
| KR | 10-2008-0076554 | 8/2008 |
| KR | 10-2013-0135043 | 12/2013 |

\* cited by examiner

DISPLAY DEVICE

CROSS-REFERENCE TO RELATED APPLICATION

This application claims priority to and the benefit of Korean Patent Application No. 10-2014-0099167, filed on Aug. 1, 2014, in the Korean Intellectual Property Office, the content of which is incorporated herein in its entirety by reference.

BACKGROUND

1. Field

Embodiments of the inventive concept relate to a curved display device with improved visibility.

2. Description of the Related Art

A liquid crystal display (LCD) includes two substrates having electrodes and a liquid crystal layer interposed between the two substrates, and liquid crystal molecules of the liquid crystal layer are rearranged upon applying voltage to the electrodes, thereby adjusting the amount of transmitted light.

A display device using an organic light emitting diode (OLED) does not require a backlight unit for light emission unlike an LCD and can be manufactured to have a thin film laminated structure, which, in turn, imparts flexibility.

Meanwhile, studies on a curved display device having a predetermined radius of curvature have been increasingly conducted in accordance with consumer needs for display device that maximize immersion.

The radius of curvature is a radius of the circular arc which best approximates the visible outline or silhouette of an object. As the radius of curvature becomes larger, the object has a smoother contour, and as the radius of curvature becomes smaller, the object has a more curved contour.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding effective filing dates of subject matter disclosed herein.

SUMMARY

Aspects of embodiments of the inventive concept are directed toward a curved display device with improved visibility.

According to an embodiment of the inventive concept, a display device includes a first substrate having a predetermined radius of curvature, a second substrate facing the first substrate, a plurality of gate lines and a plurality of data lines intersecting each other on the first substrate, a black matrix on the second substrate, at least part of the black matrix overlapping the plurality of gate lines and the plurality of data lines so as to define a plurality of pixel areas, a plurality of pixel electrodes in the plurality of pixel areas on the first substrate, and a plurality of color filters in the plurality of pixel areas on the second substrate. A distance between adjacent color filters is different depending on where the pixel areas are located.

The distance between the adjacent color filters may be larger in a central portion of the second substrate than in a side portion of the second substrate.

The distance between the adjacent color filters may gradually decrease as a distance from the central portion of the second substrate increases.

The distance between the adjacent color filters may be inversely proportional to the radius of curvature.

The display device may further include a plurality of thin film transistors on the first substrate. Each of the plurality of thin film transistors iselectrically connected to a respective gate line and a respective data line. The display device may further include a common electrode on the first substrate or the second substrate. The common electrode overlaps the plurality of pixel electrodes. And the display device may further include a liquid crystal layer interposed between the first substrate and the second substrate.

The plurality of pixel electrodes may include a fine slit pattern.

The common electrode may be disposed on the plurality of color filters.

The common electrode may include a fine slit pattern.

The common electrode may be electrically insulated from the plurality of pixel electrodes.

The display device may further include a plurality of thin film transistors disposed on the first substrate. Each of the plurality of thin film transistors is electrically connected to a respective gate line and a respective data line. And the display device may further include a plurality of light emission layers on the plurality of pixel electrodes, and a common electrode on the plurality of light emission layers.

The display device may further include at least one of a hole injection layer and a hole transport layer between the plurality of pixel electrodes and the plurality of light emission layers.

The display device may further include at least one of an electron transport layer and an electron injection layer between the plurality of light emission layers and the common electrode.

According to embodiments of the inventive concept, a display device has an effect of improvement of visibility by reducing misalignment between pixel electrodes and color filters, which can occur in a curved display device, because a distance between the color filters varies depending on where pixel areas are located in the curved display device.

The foregoing summary is illustrative only and is not intended to be in any way limiting the claims of the inventive concept. In addition to the illustrative aspects, embodiments, and features described above, further aspects, embodiments, and features will become apparent by reference to the drawings and the following detailed description.

DETAILED DESCRIPTION

Figure 1:
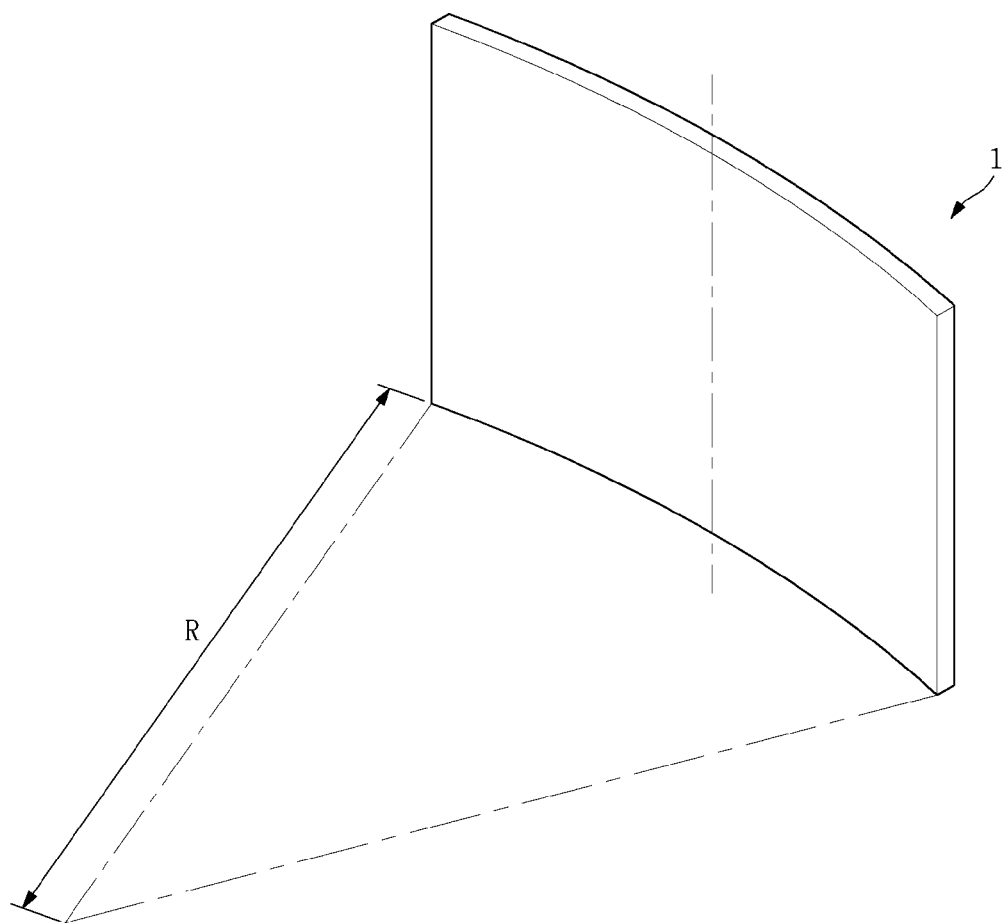
FIG. 1 is a schematic perspective view of a display device according to an embodiment of the inventive concept.

Advantages and features of structures formed in accordance with the present disclosure of inventive concept and methods for achieving them will be made clear from embodiments described below in more detail with reference to the accompanying drawings. The present teachings may, however, be embodied in many different forms and should not be construed as being limited to the specific embodiments set forth herein. Rather, these embodiments are provided so that this disclosure will be thorough and complete, and will fully convey the scope of the present teachings to those skilled in the pertinent art. Like reference numerals refer to like elements throughout the specification.

The spatially relative terms "below", "beneath", "lower", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

The terminology used herein is for the purpose of describing particular embodiments only and is not construed as limiting the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of mentioned component, step, operation and/or element, but do not exclude the presence or addition of one or more other components, steps, operations and/or elements.

Unless otherwise defined, all terms used herein (including technical and scientific terms) have the same meaning as commonly understood by those skilled in the art to which this disclosure of inventive concept pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Figure 2:
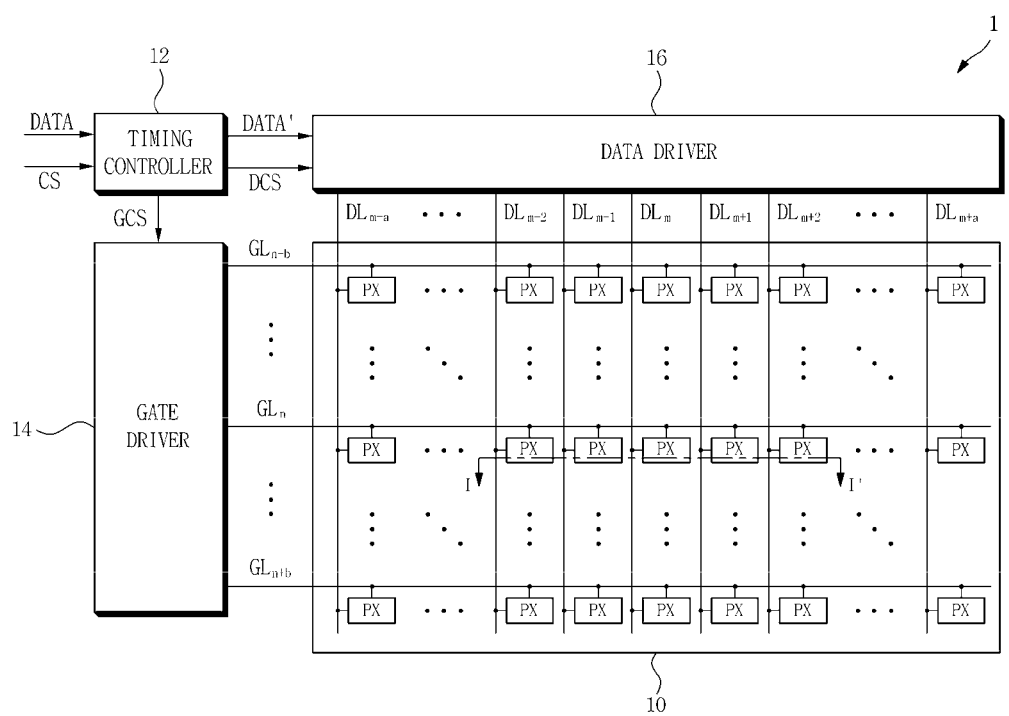
FIG. 2 is a schematic plan view illustrating the display device illustrated in FIG. 1.

FIG. 1 is a schematic perspective view of a display device according to an embodiment of the inventive concept. FIG. 2 is a schematic plan view illustrating the display device illustrated in FIG. 1.

Referring to FIGS. 1 and 2, a display device 1 according to embodiments of the inventive concept has a predetermined radius of curvature R. The display device 1 may include a display panel 10 including a plurality of pixels PXs, a timing controller 12 configured to process externally received image signals DATA and control signals CS so as to output various signals, a gate driver 14 configured to supply gate signals to gate lines ($GL_{n-b}$~$GL_{n+b}$) connected to the pixels PXs, and a data driver 16 configured to supply data signals to data lines ($DL_{m-a}$~$DL_{m+a}$) connected to the pixels PXs.

The display panel 10 may have a predetermined radius of curvature R, and for example may be a liquid crystal display (LCD). The display panel 10 may include a plurality of gate lines ($GL_{n-b}$~$GL_{n+b}$) configured to transmit gate signals in a row direction, a plurality of data lines ($DL_{m-a}$~$DL_{m+a}$) configured to transmit data signals in a column direction, and a plurality of pixels PXs arranged in a matrix form in a region where the gate and data lines intersect (or cross) each other.

A configuration of the pixel PX will be described in detail below with reference to FIGS. 3 to 5.

The timing controller 12 may output corrected image signals DATA' to the data driver 16 based on externally received image signals DATA. The timing controller 12 may supply gate control signals GCS to the gate driver 14 and may supply data control signals DCS to the data driver 16 based on externally received control signals CS. For instance, the control signals CS may be timing signals such as vertical synchronization (VSYNC), horizontal synchronization (HSYNC), clock (CLK), and data enable (DE) signals, and the image signals DATA may be digital signals that represent gray level of the pixel PX.

The gate driver 14 may receive the gate control signals GCS from the timing controller 12 so as to generate gate signals and may supply the gate signals to the pixels PXs connected to each of a plurality of gate lines ($GL_{n-b}$~$GL_{n+b}$). The gate signals may be sequentially input to the pixels PXs so that data signals may also be sequentially supplied to the pixels PXs.

The data driver 16 may receive the data control signals DCS and the corrected image signals DATA' from the timing controller 12 and may supply data signals corresponding to the corrected image signals DATA' to the pixels PXs connected to each of a plurality of data lines ($DL_{m-a}$~$DL_{m+a}$) in response to the data control signals DCS.

Figure 3:
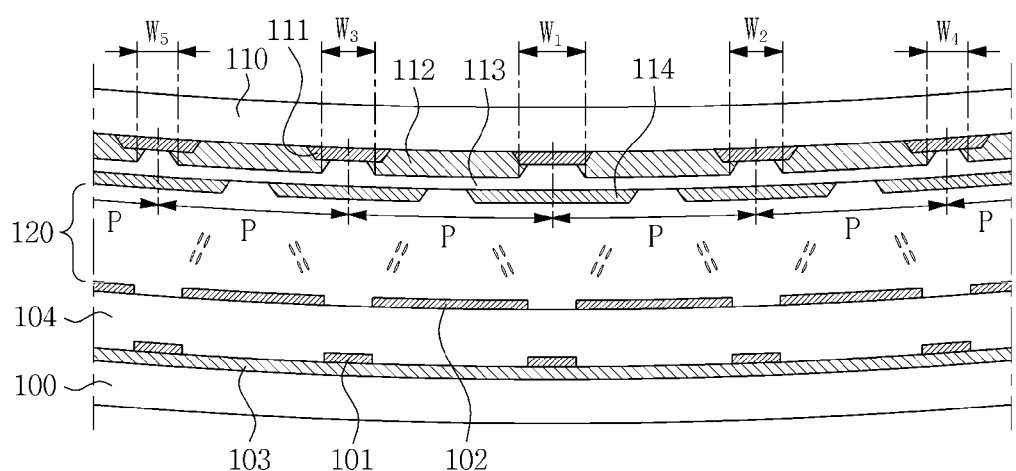
FIG. 3 is a cross-sectional view of a pixel illustrated in FIG. 2 according to an embodiment of the inventive concept, taken along line I-I' of FIG. 2.

FIG. 3 is a cross-sectional view of a pixel illustrated in FIG. 2 according to an embodiment of the inventive concept, taken along line I-I' of FIG. 2.

Referring to FIG. 3, a display device according to an embodiment of the inventive concept includes a first substrate 100 having a first predetermined radius of curvature, a second substrate 110 facing the first substrate 100 and having a second predetermined radius of curvature, and a liquid crystal layer 120 interposed between the first and second substrates 100 and 110.

A data line 101 and a gate line (not shown) may be disposed on the first substrate 100 and as illustrated in FIG. 2, the data line 101 and the gate line may intersect each other. A gate insulating layer 103 may be disposed between the data line 101 and the gate line on the first substrate 100.

A pixel electrode 102 may be disposed in a pixel area P on the first substrate 100 and a first insulating layer 104 may be disposed between the pixel electrode 102 and the data line 101. The pixel area P will be described in detail when a black matrix 111 is described.

The pixel electrode 102 may include a fine slit pattern. The fine slit pattern may be formed in various shapes and the scope of the inventive concept is not restricted or in any way limited to the shapes of the fine slit pattern.

Although not illustrated in FIG. 3, a thin film transistor (TFT) connected to the gate line and the data line 101 may be disposed on the first substrate 100. The TFT may include a gate electrode connected to the gate line, a source electrode connected to the data line 101, and a drain electrode connected to the pixel electrode 102 through a contact opening (e.g., hole). The gate, source, and drain electrodes may be insulated from each other by the gate insulating layer 103. A semiconductive layer (not shown) may be disposed between the source and drain electrodes and the gate insulating layer 103.

The black matrix 111 may be disposed on the second substrate 110 and at least part of the black matrix 111 may overlap the gate line and the data line 101 so as to define the pixel area P. That is, the pixel area P may be defined as an area that is formed by connecting central portions of the black matrix 111 that is partially overlap the gate line and the data line 101. One pixel area P may include at least one pixel electrode 102 and one color filter 112.

The color filters 112 may be disposed in the pixel area P on the second substrate 200 and the color filters 112 disposed in the pixel areas P horizontally adjacent to each other may have different colors from each other. In one embodiment, the color filters 112 may be disposed in the order of red, green, and blue colors, or may be disposed in the order of red, green, blue, and white colors. However, the color filters 112 may be arranged in a variety of ways and the scope of the inventive concept is not restricted or in any way limited to the arrangements.

The color filters 112 may be spaced apart from each other at varying distances depending on where the pixel areas P are located. The distance between the color filters 112 may be desirably larger in a central portion of the second substrate 110 than in a side portion of the second substrate 110.

Further, the distance between the color filters 112 may gradually decrease as a distance from the central portion of the second substrate 110 increases. In this case, the distance between the color filters 112 may be inversely proportional to the radius of curvature of the second substrate 110. As illustrated in FIG. 3, a distance ($W_1$) between the color filters 112 in the central portion of the second substrate 110 may be larger than distances ($W_2$ and $W_4$) between the color filters 112 on the right side of the second substrate 110 or distances ($W_3$ and $W_5$) between the color filters 112 on the left side of the second substrate 110. In this case, the distances $W_2$ and $W_3$ may be equal to each other. The distances $W_4$, and $W_5$ may be equal to each other. Difference between the distances $W_1$ and $W_2$ may be smaller than difference between the distances $W_2$ and $W_4$. Difference between the distances $W_1$ and $W_3$ may be smaller than difference between the distances $W_3$ and $W_5$. Further, the difference between adjacent distances may gradually increase according to an increase in a distance from the central portion of the second substrate 110.

Thus, the distance between the color filters 112 may gradually decrease as a distance from the central portion of the second substrate 110 increases.

According to an embodiment, the color filters 112 may be spaced apart from each other at varying distances depending on where the pixel areas P are located, thereby reducing misalignment between the color filter 112 and the pixel electrode 102, which can occur in a curved display device having a predetermined radius of curvature, so that visibility may be improved.

A common electrode 114 disposed on the color filter 112 on the second substrate 110 may overlap the pixel electrode 102 and a second insulating layer 113 may be disposed between the common electrode 114 and the color filter 112. However, the locations of the common electrode 114 and the pixel electrode 102 may be changed.

The common electrode 114 may include a fine slit pattern. The fine slit pattern may be formed in various shapes and the scope of the inventive concept is not restricted or in any way limited to the shapes of the fine slit pattern.

According to an embodiment, the display device may include the pixel electrode 102 including a fine slit pattern and the common electrode 114 including a fine slit pattern. In this case, alignment layers (not shown) may be disposed on the pixel electrode 102 and the common electrode 114 for alignment of liquid crystals of the liquid crystal layer 120. The liquid crystal layer 120 may include vertical alignment type liquid crystals.

Figure 4:
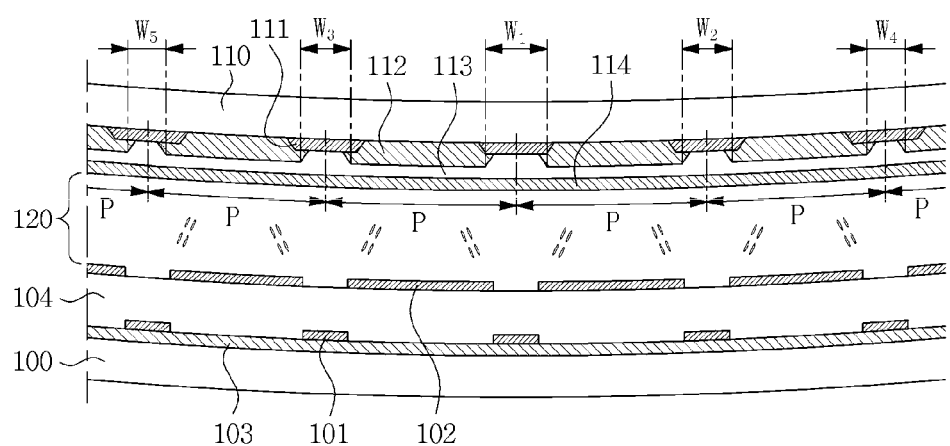
FIG. 4 is a cross-sectional view of a pixel illustrated in FIG. 2 according to another embodiment of the inventive concept, taken along line I-I' of FIG. 2.

FIG. 4 is a cross-sectional view of a pixel illustrated in FIG. 2 according to another embodiment of the inventive concept, taken along line I-I' of FIG. 2.

Referring to FIG. 4, a display device according to another embodiment may have the same configuration as the display device illustrated in FIG. 3, except for the shape of the common electrode 114, and thus descriptions of the same configuration will be omitted for brevity.

The common electrode 114 may be formed in a plate shape on the color filter 112 on the second substrate 110, but embodiments of the inventive concept are not limited thereto. The locations of the common electrode 114 and the pixel electrode 102 may be changed. The liquid crystal layer 120 may include vertical alignment type liquid crystals.

According to another embodiment, the display device includes the pixel electrode 102 including a fine slit pattern and the plate-shaped common electrode 114.

Figure 5:
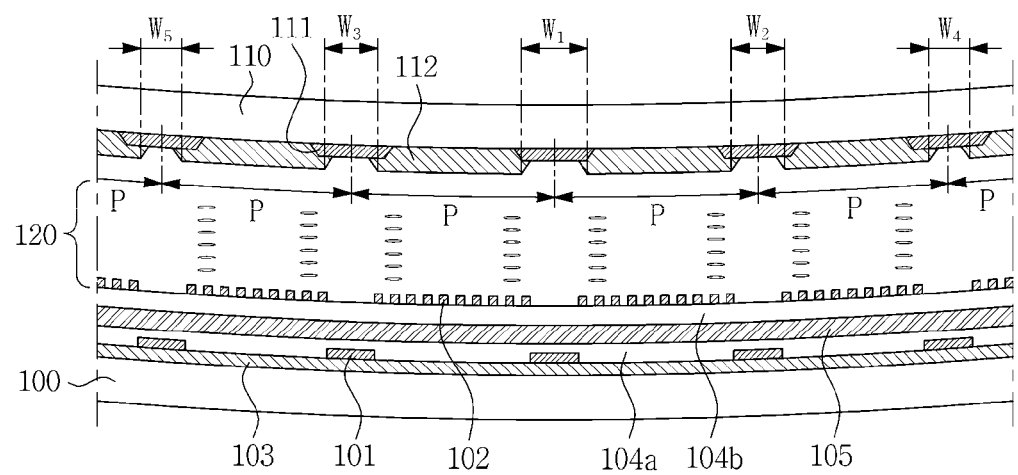
FIG. 5 is a cross-sectional view of a pixel illustrated in FIG. 2 according to yet another embodiment of the inventive concept, taken along line I-I' of FIG. 2.

FIG. 5 is a cross-sectional view of a pixel illustrated in FIG. 2 according to yet another embodiment of the inventive concept, taken along line I-I' of FIG. 2.

Referring to FIG. 5, the display device according to yet another embodiment may have the same configuration as the display device illustrated in FIG. 3, except for the location of the common electrode 105. In this case, the pixel electrode 102 and the common electrode 105 are disposed on the first substrate 100. Descriptions of the same configuration will be omitted for brevity.

A plate shaped common electrode 105 is disposed on the data line 101 with an intervening insulating layer 104a. The pixel electrode 102 and the common electrode 105 may be disposed on the first substrate 100 and may overlap to each other with an intervening insulating layer 104b.

A display device according to yet another embodiment includes the line-shaped pixel electrode 102 and the plate-shaped common electrode 105. In this case, a parabola-shaped (parabolic) electric field may be formed between the pixel electrode 102 and the common electrode 105 unlike FIGS. 3 and 4. The crystal layer 120 may include in-plane switching type liquid crystals.

Figure 6:
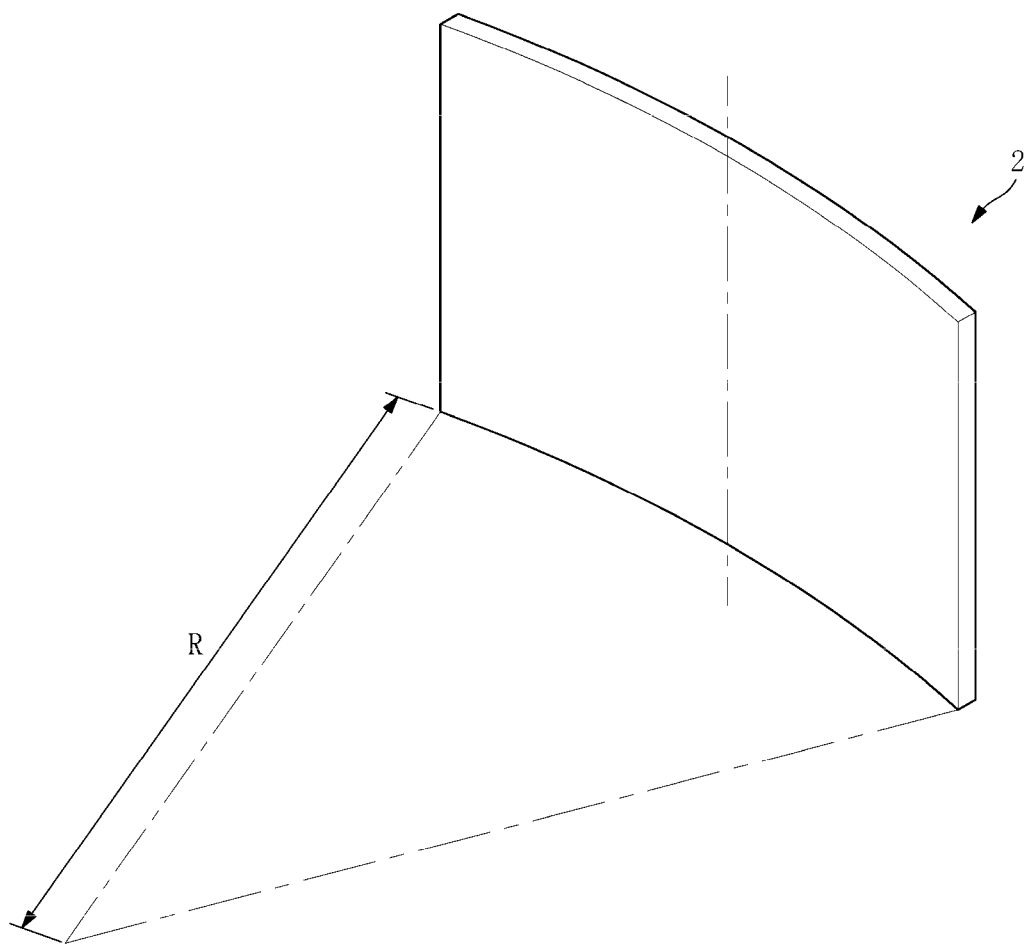
FIG. 6 is a schematic perspective view illustrating a display device according to another embodiment of the inventive concept.
Figure 7:
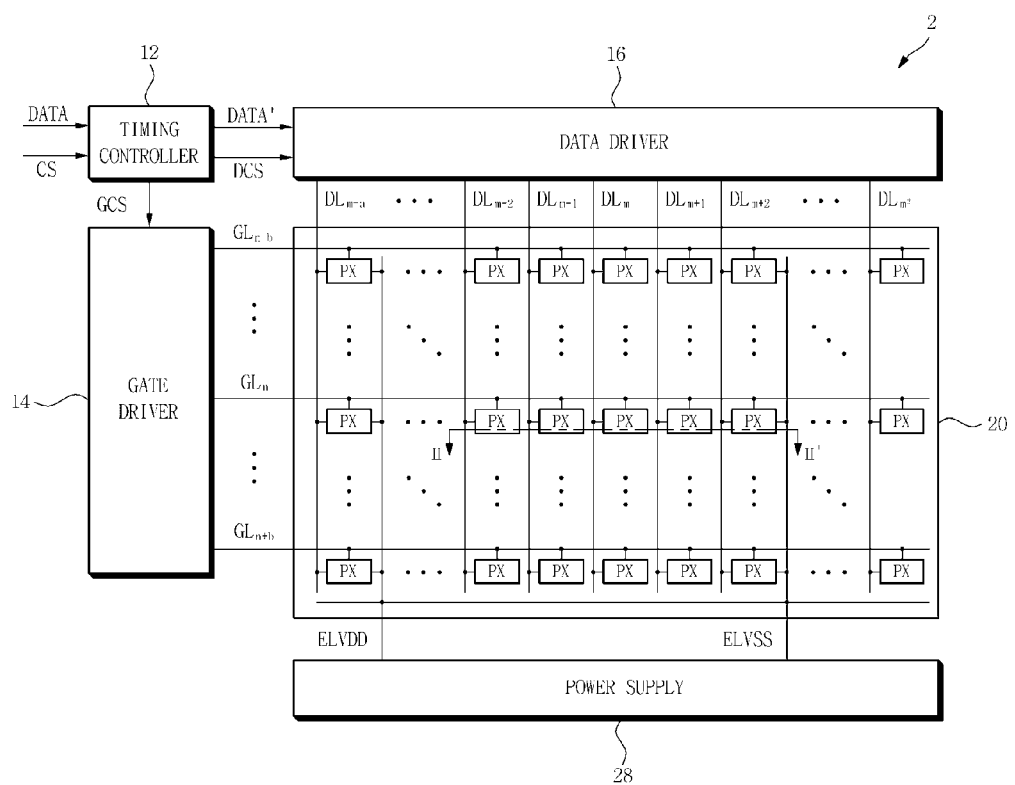
FIG. 7 is a schematic plan view of the display device illustrated in FIG. 6.

FIG. 6 is a schematic perspective view illustrating a display device according to another embodiment of the inventive concept. FIG. 7 is a schematic plan view of the display device illustrated in FIG. 6.

Referring to FIG. 7, the display device 2 according to another embodiment of the inventive concept has a different configuration of a display panel 20 and further includes a power supply 28 as compared to the display device 1 illustrated in FIG. 2. The other configurations of the display device 2 may be consistent with those of the display device 1 illustrated in FIG. 2, and thus descriptions of the same configurations will be omitted for brevity.

The display panel 20 may have a predetermined radius of curvature R and may utilize, for example, an organic light emitting diode (OLED). The configuration of a pixel PX included in the display panel 20 will be described below with reference to FIG. 8.

The power supply 28 may generate driving power ELVDD and ground power ELVSS and provide the display panel 20 with the driving power ELVDD and ground power ELVSS. Both the driving power ELVDD and ground power ELVSS may be applied to a plurality of pixels PXs of the display panel 20 so as to enable the pixels PXs to emit light.

Voltage values of the driving power ELVDD and ground power ELVSS may determine values of an electric current that flows in the pixels PXs which determines luminance when light is emitted.

The power supply 28 may be a single bank type in which the power supply 28 is disposed only below the display panel 20, but embodiments of the inventive concept are not limited thereto. The power supply 28 may be a dual bank type in which two power supplies are disposed above and below the display panel 20 so that a power line between the pixel PX and the power supply 28 may become shorter, thereby reducing voltage drop.

Figure 8:
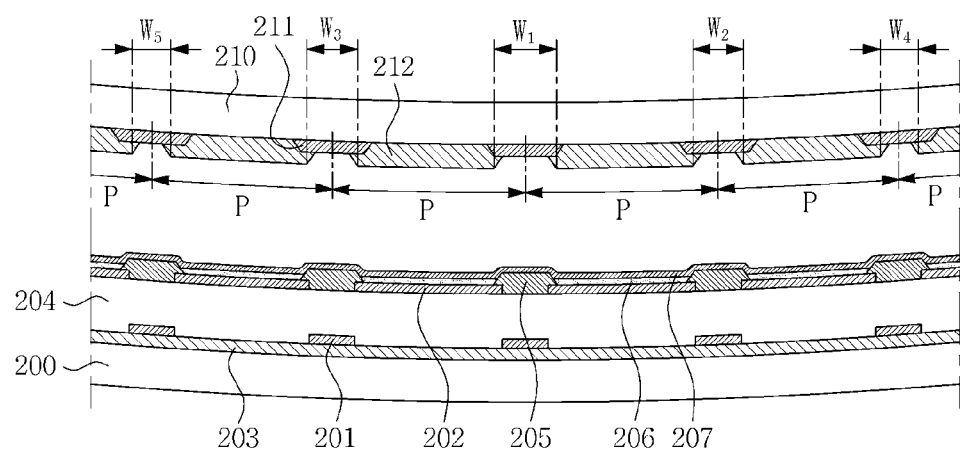
FIG. 8 is a cross-sectional view of a pixel illustrated in FIG. 7, taken along line II-II' of FIG. 7.

FIG. 8 is a cross-sectional view of a pixel illustrated in FIG. 7, taken along line II-II' of FIG. 7.

Referring to FIG. 8, a display device according to another embodiment includes a first substrate 200 having a first predetermined radius of curvature and a second substrate 210 facing the first substrate 200 and having a second predetermined radius of curvature.

The configurations of a gate line (not shown), a data line 201, a pixel electrode 202, a gate insulating layer 203, and an insulating layer 204, which are disposed on the first substrate 200, and the configurations of a black matrix 211 and a color filter 212, which are disposed on the second substrate 210, may be the same as those of FIGS. 3 to 5, and thus descriptions of the same configurations will be omitted for brevity.

A pixel defined layer 205 may be disposed between the pixel electrodes 202 and may be made of polyacrylate resins, polyimide resins, or the like.

A light emission layer 206 may be disposed on the pixel electrode 202 and may include a low molecular weight organic material or a high molecular weight organic material.

A common electrode 207 may be disposed on the pixel defined layer 205 and the light emission layer 206 and may be any one of a transmissive electrode, a transflective electrode, and/or a reflective electrode.

A transparent conductive oxide (TCO) may be used to form the transmissive electrode. Examples of the TCO may include indium tin oxide (ITO), indium zinc oxide (IZO), zinc oxide (ZnO), and/or indium oxide ($In_2O_3$).

A metal such as magnesium (Mg), silver (Ag), gold (Au), calcium (Ca), Lithium (Li), chromium (Cr), aluminum (Al), and copper (Cu), or alloys thereof may be used to form the transflective electrode and the reflective electrode, but embodiments of the inventive concept are not limited thereto. The transflective electrode and the reflective electrode may have a multilayer structure that includes a metal layer made of a metal or an alloy thereof and a transparent conductive oxide (TCO) layer laminated on the metal layer.

Although not illustrated in FIG. 8, at least one of a hole injection layer (HIL) and/or a hole transport layer (HTL) may be disposed between the pixel electrode 202 and the light emission layer 206, and at least one of an electron transport layer (ETL) and/or an electron injection layer (EIL) may be disposed between the light emission layer 206 and the common electrode 207. Further, a thin film encapsulation layer may be disposed on the common electrode 207.

The thin film encapsulation layer may include one or more inorganic layers and one or more organic layers. Further, the thin film encapsulation layer may have a laminated structure in which the inorganic layers and the organic layers are alternately laminated.

The inorganic layers may be formed of one or more inorganic substances selected from $Al_2O_3$, $TiO_2$, $ZrO$, $SiO_2$, AlON, AlN, SiON, $Si_3N_4$, ZnO, and/or $Ta_2O_5$. The inorganic layers may be formed by utilizing a chemical vapor deposition (CVD) method or an atomic layer deposition (ALD) method, but embodiments of the inventive concept are not limited to these methods. The inorganic layers may be formed by utilizing many different suitable methods which are known to those skilled in the art.

The organic layers may be made of a polymer material. Examples of the polymer material include acrylic resin, epoxy resin, polyimide, polyethylene, and the like. The organic layers may be formed through a thermal deposition process. The thermal deposition process for forming the organic layers may be performed at a suitable temperature at which the light emission layer 206 is not likely to be damaged. However, embodiments of the inventive concept are not limited thereto, and the organic layers may be formed by utilizing many different suitable methods known to those skilled in the art.

From the foregoing, it will be appreciated that various embodiments of the inventive concept have been described herein for purposes of illustration, and that various modifications may be made without departing from the scope and spirit of the present disclosure. Accordingly, the various embodiments disclosed herein are not intended to limit the scope of the inventive concept, and the true scope and spirit of the inventive concept is indicated by the following claims, and equivalents thereof.

What is claimed is:

1. A display device comprising: a first substrate having a predetermined radius of curvature; a second substrate facing the first substrate; a plurality of gate lines and a plurality of data lines intersecting each other on the first substrate; a black matrix on the second substrate, at least part of the black matrix overlapping the plurality of gate lines and the plurality of data lines so as to define a plurality of pixel areas; a plurality of pixel electrodes in the plurality of pixel areas on the first substrate; and a plurality of color filters in the plurality of pixel areas on the second substrate, wherein a distance between adjacent color filters is different depending on where the pixel areas are located, and wherein the distance between the adjacent color filters is larger in a central portion of the second substrate than in a side portion of the second substrate.

2. The display device of claim 1, wherein the distance between the adjacent color filters gradually decreases as a distance from the central portion of the second substrate increases.

3. The display device of claim 2, wherein the distance between the adjacent color filters is inversely proportional to the radius of curvature.

4. The display device of claim 1, further comprising:
a plurality of thin film transistors on the first substrate, each of the plurality of thin film transistors being electrically connected to a respective gate line and a respective data line;
a common electrode on the first substrate or the second substrate, the common electrode overlapping the plurality of pixel electrodes; and
a liquid crystal layer interposed between the first substrate and the second substrate.

5. The display device of claim 4, wherein the plurality of pixel electrodes comprise a fine slit pattern.

6. The display device of claim 4, wherein the common electrode is disposed on the plurality of color filters.

7. The display device of claim 6, wherein the common electrode comprises a fine slit pattern.

8. The display device of claim 4, wherein the common electrode is electrically insulated from the plurality of pixel electrodes.

9. The display device of claim 1, further comprising:
a plurality of thin film transistors on the first substrate, each of the plurality of thin film transistors being electrically connected to a respective gate line and a respective data line;
a plurality of light emission layers on the plurality of pixel electrodes; and
a common electrode on the plurality of light emission layers.

10. The display device of claim 9, further comprising at least one of a hole injection layer and a hole transport layer between the plurality of pixel electrodes and the plurality of light emission layers.

11. The display device of claim 10, further comprising at least one of an electron transport layer and an electron injection layer between the plurality of light emission layers and the common electrode.

* * * * *